US006359214B1

(12) United States Patent
Worley et al.

(10) Patent No.: US 6,359,214 B1
(45) Date of Patent: Mar. 19, 2002

(54) SERRATED EMI GASKET AND COMPUTER SYSTEM WITH IMPROVED EMI SHIELDING

(75) Inventors: Richard N. Worley, Cedar Park; Leroy Jones, Jr.; Steve L. Williams, both of Round Rock, all of TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/429,201

(22) Filed: Oct. 28, 1999

(51) Int. Cl.[7] .................................................. H05K 9/00

(52) U.S. Cl. .............................. 174/35 GC; 174/35 R; 361/818; 277/920

(58) Field of Search .......................... 174/35 GC, 35 R, 174/35 MS; 409/609, 927; 361/816, 818; 277/228, 229, 235 R

(56) References Cited

U.S. PATENT DOCUMENTS 4,594,472 A 6/1986 Brettle et al.
4,889,959 A * 12/1989 Taylor et al. .......... 174/35 GC
5,115,104 A * 5/1992 Bunyan ................. 174/35 GC
5,483,423 A * 1/1996 Lewis et al. ................ 361/816
5,656,795 A 8/1997 Miska
5,804,762 A * 9/1998 Jones et al. ............ 174/35 GC

FOREIGN PATENT DOCUMENTS

EP 0403112 * 12/1990 ............ 174/35 GC
WO WO-98/54942 * 12/1998

* cited by examiner

*Primary Examiner*—Anthony Dinkins
*Assistant Examiner*—Carmelo Oliva
(74) *Attorney, Agent, or Firm*—Russell D. Culbertson; Shaffer & Culbertson, LLP

(57) ABSTRACT

An EMI gasket (20) includes a plurality of serrations (34) along at least one edge (35, 36). The serrations (34) are arranged side-by-side so that each may be articulated individually. That is, one of the serrations (34) may be displaced significantly out of the plane of the gasket without affecting adjacent serrations. Thus, when the edge of the gasket (20) is compressed between two surfaces which include a discontinuity (40) such as a step or protuberance between them, the serration in contact with the discontinuity is displaced out of the plane of the gasket without displacing adjacent portions of the gasket. Allowing a portion of an EMI gasket (20) to be displaced out of the plane of the gasket without affecting adjacent portions of the gasket substantially reduces or eliminates gaps which occur due to the failure of the gasket to precisely follow the contour of a component.

16 Claims, 4 Drawing Sheets

SERRATED EMI GASKET AND COMPUTER SYSTEM WITH IMPROVED EMI SHIELDING

TECHNICAL FIELD OF THE INVENTION

This invention relates to EMI shielding and, more particularly, to an EMI gasket structure which improves EMI shielding arrangements. The invention also encompasses a method of forming an EMI shield and a computer system employing the EMI gasket structure.

BACKGROUND OF THE INVENTION

Many types of electronic circuits, including high-frequency digital circuits, produce alternating electromagnetic fields in the course of operation. Also, an electronic circuit may be sensitive to certain electromagnetic fields arising from external sources, and may fail to operate properly within the presence of such fields. To avoid problems arising from electromagnetic fields emanating from, or incident upon, an electronic circuit, such circuits are commonly protected by an electrically conductive shield or barrier. This electrically conductive shield extends around the entire circuit and is commonly referred to as an electromagnetic interference or EMI shield.

Part of the electrical energy incident on an EMI shield is reflected while part of the energy induces alternating electrical currents in the material which forms the EMI shield. These alternating currents are dissipated by eddy currents in the EMI shielding material. Thus, the EMI shield attenuates the incident electromagnetic fields so that fields emanating from circuitry within the shielded area do not interfere with external circuitry. Similarly, the EMI shielding helps prevent fields emanating from outside the shielded area from interfering with the shielded circuitry.

EMI shielding for electronic circuitry is commonly formed by a housing or enclosure associated with the particular circuitry. In a computer system, for example, the enclosure which houses the system processor, random access memory, and related devices commonly includes structures which connect together to form an EMI shield. Other shielding may be used within the primary enclosure for shielding particular circuits in the system. Regardless of whether an EMI shield is included with a component in a shielded system or stands alone, conductive gaskets, referred to as "EMI gaskets," may be used to help make good electrical contact between the various components which make up the shield. EMI gaskets generally include an electrically conductive material overlaying a resilient core material which is readily compressed as the pieces which make up an EMI shield are connected together.

FIG. 1 shows a portion of a prior art EMI gasket 10 compressed between two components which make up a portion of an EMI shield. The illustrated components comprise a base portion 11 of an input/output connector 12 associated with a computer system, and a wall 14 of the computer system chassis. Chassis wall 14 includes a cut out or opening for receiving the connector 12 so that the wall and base 11 cooperate to form a portion of the EMI shield for the computer system. In order to provide better electrical continuity between chassis wall 14 and connector base 11, EMI gasket 10 is compressed between the two components as they are connected together.

However, FIG. 1 shows that a prior art EMI gasket may leave a gap 15 where a discontinuity in the components prevents the two components from perfectly abutting each other. Gaps between an EMI shielding component such as base 11 and the EMI gasket 10 may allow shorter wavelength electromagnetic energy to penetrate the shield. Such gaps are a particular problem in digital circuits which operate at high clock rates due to the short wavelength electromagnetic energy which may emanate from these circuits. At higher clock rates, clock rates over 300 MHz for example, even small gaps in the EMI shielding may be unacceptable.

SUMMARY OF THE INVENTION

It is an object of the invention to provide an EMI gasket which reduces gaps between components intended to cooperate to provide an EMI shield. It is also an object of the invention to provide a method for reducing or limiting gaps in an EMI shield. Another object of the invention is to provide a computer system with improved EMI shielding.

An EMI gasket according to the invention includes a plurality of serrations along at least one edge. The serrations are arranged side-by-side so that each may be articulated individually. That is, one of the serrations may be displaced significantly out of the plane of the gasket without affecting adjacent serrations. Thus, when the edge of the gasket is compressed between two surfaces which include a discontinuity such as a step or protuberance between them, the serration in contact with the discontinuity is displaced out of the plane of the gasket without displacing adjacent portions of the gasket. Allowing a portion of an EMI gasket to be displaced out of the plane of the gasket without affecting adjacent portions of the gasket substantially reduces or eliminates gaps which occur due to the failure of the gasket to precisely follow the contour of a component.

In the preferred form of the invention the gasket includes a resilient material which may form a core for the gasket. An electrically conductive material is associated with the resilient material and preferably comprises a cover which substantially covers the resilient core material. Serrations along an edge of the gasket are formed by making a number of spaced apart cuts along the gasket edge. Each cut extends substantially normal to the respective edge in which the cut is formed.

The method of forming an EMI shield according to the invention comprises placing the serrated EMI gasket between an electrically conductive first surface and a second surface. The method then includes compressing the gasket between the surfaces. As the gasket is compressed, at least one serration is displaced from the plane of the gasket over a protuberance on the first surface. Adjacent serrations which do not contact the protuberance remain in the plane of the gasket with no gap forming between the adjacent serrations and the first surface.

An EMI gasket according to the invention is particularly useful in a computer system using high clock rates. A computer system according to the invention includes a first structure and a second structure, at least one of which forms part of an EMI shield for the computer. A serrated EMI gasket is interposed between the first structure and second structure to form a good EMI shield despite any protuberances or other discontinuities which may be present on the structure forming part of the EMI shield. The serrations reduce or eliminate the gaps which the discontinuity would otherwise cause between the gasket material and the surface of the structure forming part of the EMI shield.

These and other objects, advantages, and features of the invention will be apparent from the following description of the preferred embodiments, considered along with the accompanying drawings.

DESCRIPTION OF THE PREFERRED EMBODIMENTS

Figure 3:
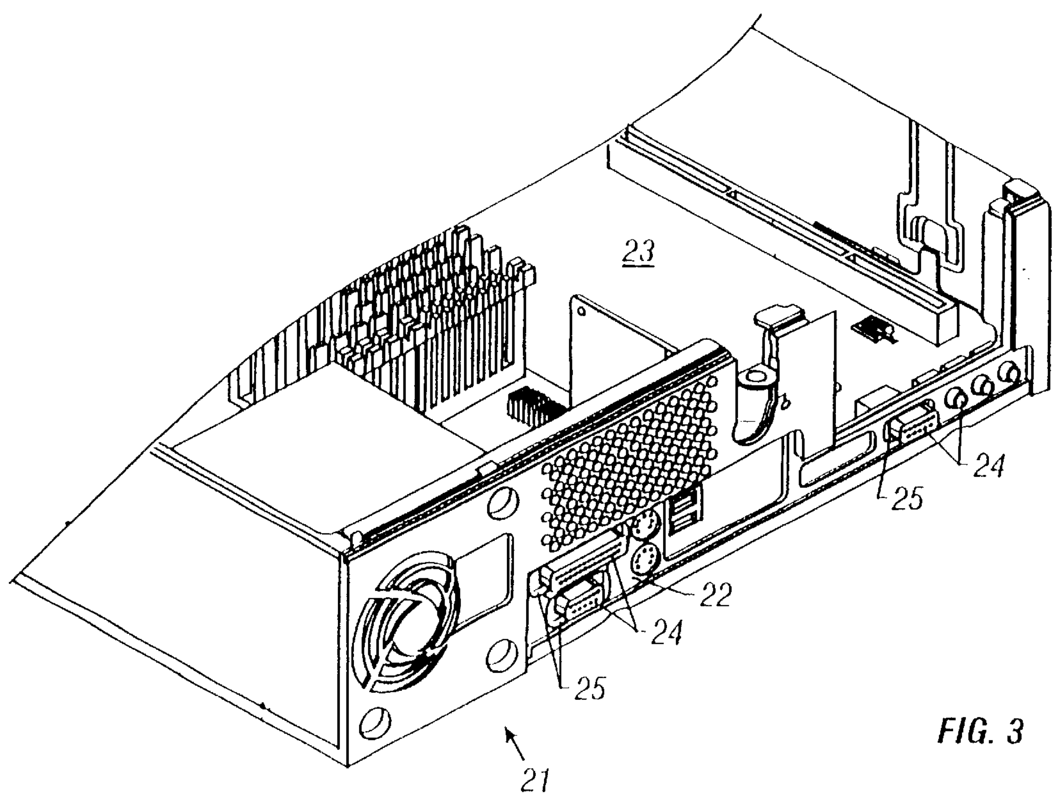
FIG. 3 is a view in perspective similar to FIG. 2, but showing the printed circuit board and computer chassis in a connected position sandwiching the EMI gasket.
Figure 2:
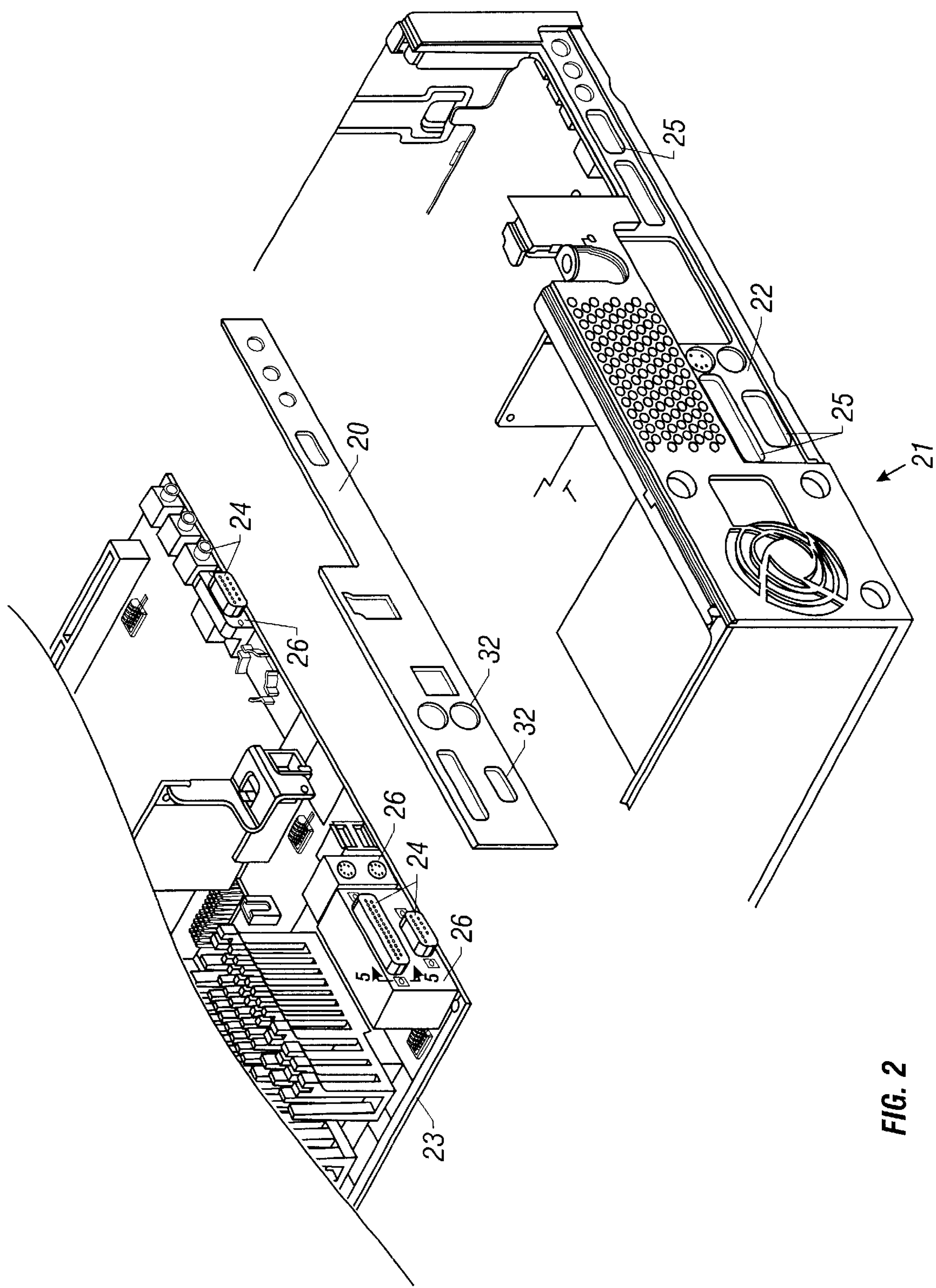
FIG. 2 is an exploded view in perspective showing a printed circuit board, a computer chassis, and an EMI gasket embodying the principles of the invention.

FIGS. 2 and 3 show an EMI gasket 20 embodying the principles of the invention, used in a computer system. The computer system includes a chassis 21 having a chassis wall 22. The computer system also includes a printed circuit board 23 on which are amounted a number of electronic components of the computer system along with several input/output connectors 24. Although each input/output connector is labeled with the common reference number 24, it will be appreciated that the various illustrated connectors comprise different types of connectors including mouse and keyboard connectors, universal serial bus (USB) connectors, a monitor connector, and parallel and serial port connectors.

Chassis wall 22 includes a number of cutouts 25 for accommodating the input/output connectors 24. Some of the connectors 24 may extend through the respective cutout 25, while other connectors are recessed from the respective cutout. In any event, each input/output connector 24 includes a base portion 26 shown best in FIG. 2. As indicated in both FIGS. 2 and 3, the printed circuit board 23 is mounted within the computer chassis 21 so that each connector 24 aligns with a cutout 25 and the connector base 26 of each respective input/output connector 24 generally abuts the inner surface of the chassis wall 22 around the respective cutout. Chassis wall 22, together with the bases 26 of the various input/output connectors 24, form a portion of the primary EMI shield for the computer system. EMI gasket 20 is used to help ensure good electrical continuity between each connector base 26 and the chassis wall 22. Gasket 20 also extends to the periphery of chassis wall 22 where the wall connects with other components (not shown) of the computer system enclosure. These other components of the system enclosure continue the EMI shield around the system.

Figure 4:
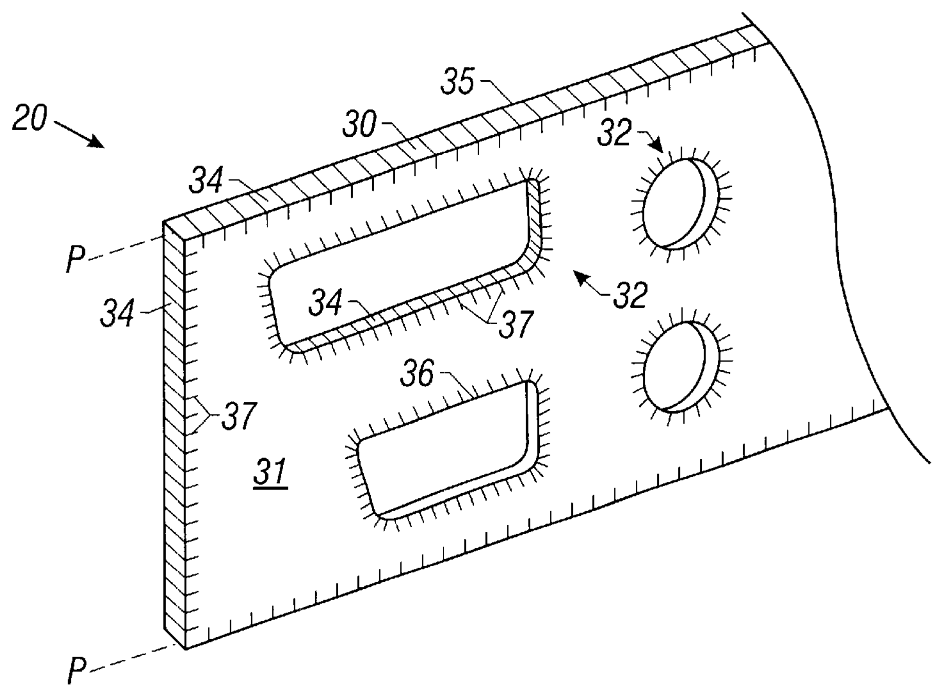
FIG. 4 is an enlarged view in perspective of a portion of the EMI gasket shown in FIG. 2.

Referring now particularly to FIG. 4, the preferred EMI gasket 20 includes a core material 30 and a cover material 31. Gasket openings 32 correspond generally to the cutouts 25 in chassis wall 22. Core material 30 comprises a suitable resilient material such as a suitable foam rubber or plastic. Cover material 31 comprises a suitable conductive material such as a fabric formed from conductive carbon fibers or metal fibers. It will be appreciated by those skilled in the art that the illustrated resilient core/conductive cover type EMI gasket material is only one example of the types of EMI gasket materials in which the present invention may be employed. Other types of EMI gasket materials may include conductive fibers embedded in a resilient material. Still other types of EMI gasket materials may comprise conductive materials arranged to provide the resilient or crushable structure desired in an EMI gasket material. Each of these EMI gasket materials is to be considered equivalent to the resilient core/conductive cover type gasket material shown for purposes of example in the accompanying figures.

According to the invention, EMI gasket 20 includes a plurality of serrations 34 along at least one edge. In the illustrated form of the invention, each edge of gasket 20 includes serrations 34, including both outer edges 35 and the inner edges 36 of openings 32 in the gasket. Serrations 34 are arranged in a side-by-side fashion and are formed by a plurality of spaced apart cuts 37. Each cut 37 preferably extends substantially normal to the edge in which it is formed, although the cuts could be formed at other angles to the respective edge. As will be discussed below with respect to a specific example, each serration 34 is independently articulating. That is, each serration 34 may be moved laterally with respect to the plane P of the gasket. Plane P, shown both in FIGS. 4 and 5, may be defined for purposes of this disclosure and the accompanying claims as a plane bisecting the gasket through the center of the gasket material. In the illustrated case, plane P extends through the center of the resilient core material 30.

Figure 5:
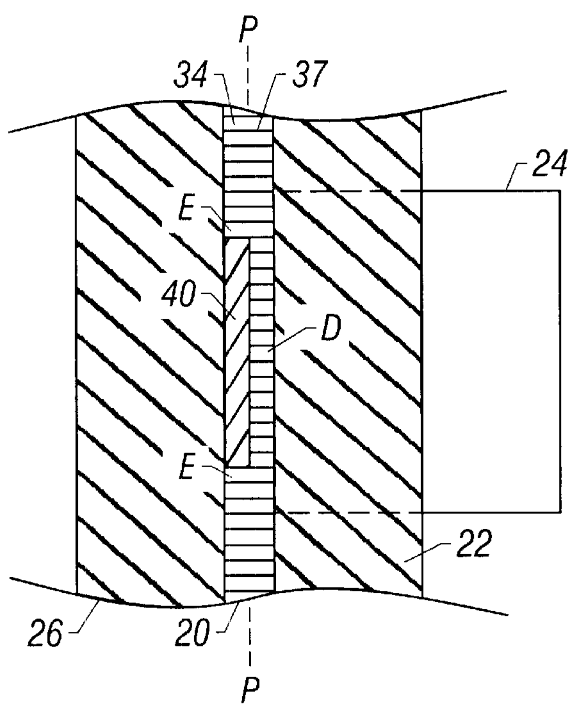
FIG. 5 is a view in section take along line 5—5 in FIG. 3, showing the EMI gasket embodying the principles of the invention accommodating a discontinuity between components to help reduce gaps in an EMI shield.

The ability of EMI gasket 20 to prevent or reduce gaps in an EMI shield may now be described with particular reference to FIG. 5. FIG. 5 comprises a section view taken along line 5—5 in FIG. 3, and shows an input/output connector 24 extending through a cutout 25 in chassis wall 22. Gasket 20 is compressed between connector base 26 and chassis wall 22. Gasket 20 is shown in FIG. 5 as a monolithic material to simplify the drawing. It will be appreciated that gasket 20 may still comprise a core and separate conductive cover. Also, section lines are omitted from gasket 20 in FIG. 5 so that cuts 37 are more readily seen.

Figure 1:
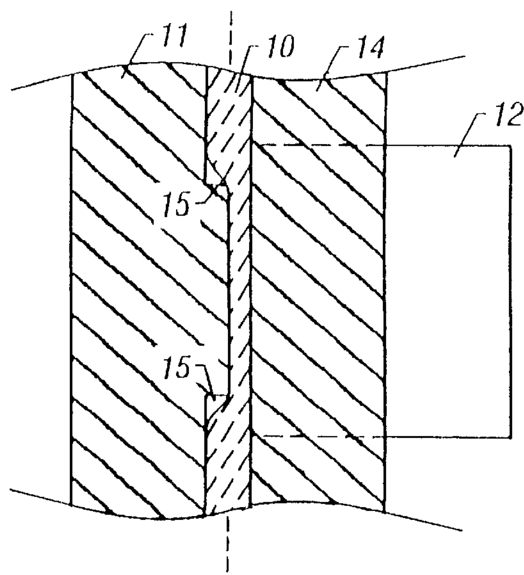
FIG. 1 is a view in section of a prior art EMI gasket, showing a gap resulting from a discontinuity in one of the conductive surfaces abutting the gasket.

Similarly to FIG. 1, described above to show the deficiencies of prior art EMI gaskets, connector base 26 includes a discontinuity or protuberance 40. Due to this physical discontinuity 40, the surface of connector base 26 and the inner surface of chassis wall 22 cannot abut each other perfectly. However, the group of serrations 34 residing along the length of the discontinuity 40 can be displaced somewhat out of the plane P of the gasket to accommodate the discontinuity. This group of serrations 34 is shown generally at reference letter D in FIG. 5. In this example, each of the serrations 34 in group D is compressed more than adjacent serrations, and this additional compression moves the serrations in the group out of plane P. According to the invention, even though the group D of serrations 34 are displaced out of the plane P of the gasket, the serrations shown at reference letter E at the ends of discontinuity 40, remain flush against both chassis wall 22 and connector base 26. The ability of the serrations 34 to articulate independently of adjacent serrations allows the serrations to follow the contour of the discontinuity 40. Thus, no gap is formed on either side of the discontinuity 40. This is in contrast to gaps 15 which result from the prior art EMI gasket 10 shown in FIG. 1.

The width of serrations 34 in an EMI gasket 20 according to the invention may be optimized for a particular application. Also, a single gasket 20 may include serrations of different widths. In any application, serration widths are chosen so that any gap in the EMI shield is less than one twentieth of the wavelength of the highest frequency in the shielded area. This maximum allowable gap may be accomplished in some applications with relatively wide serrations depending upon the frequencies employed by the circuitry in the shielded area and the nature of the enclosure. Generally, narrower serrations 34 are required for use in forming shields for higher frequencies. For example, serrations having a width of approximately 4 millimeters may be suitable for use with circuits which may emit electromagnetic radiation at frequencies on the order of 1 GHz.

Figure 6:
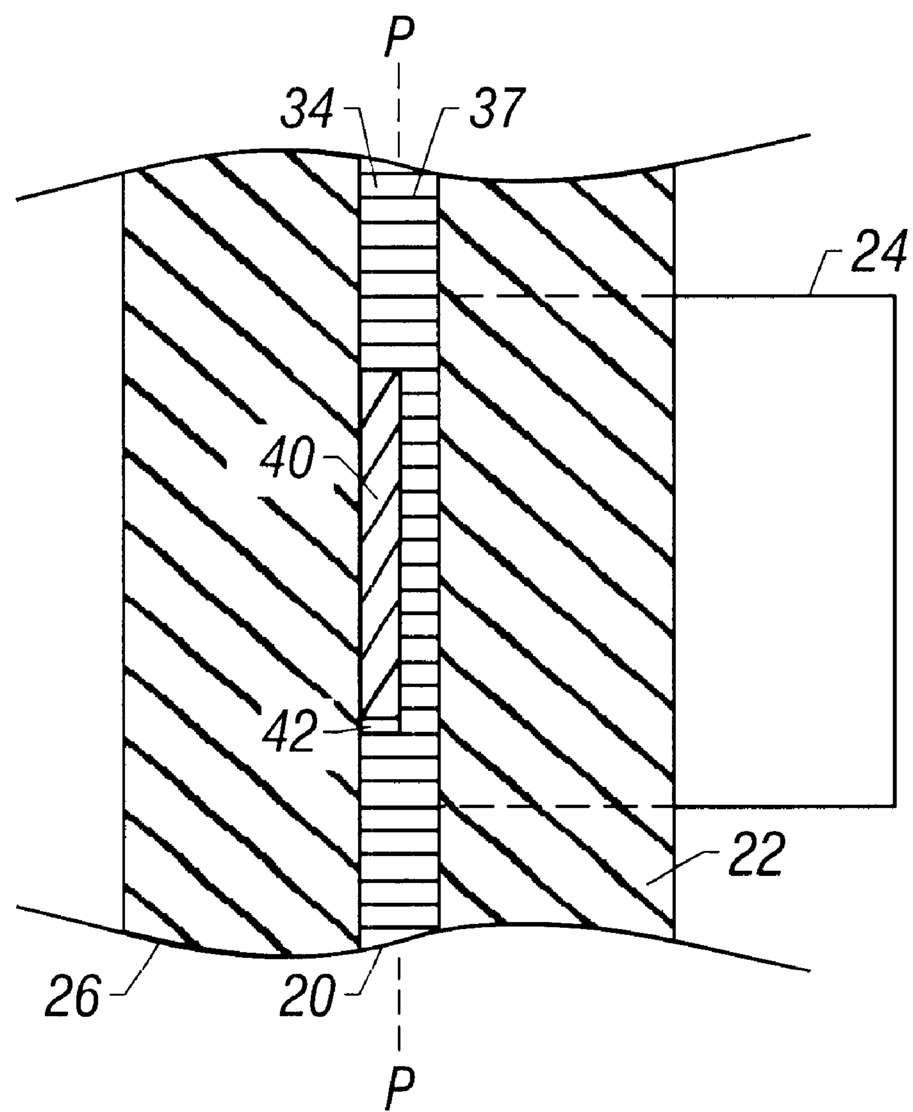
FIG. 6 is a view similar to FIG. 5, but showing the case where the serration does not align perfectly with a surface discontinuity.

The spacing between adjacent cuts 37 and resultant width of the serrations 34 is preferably chosen so that a cut will either directly align with or be very near the edge of the discontinuity, regardless of where discontinuity may be found. If cuts 37 are spaced too widely apart leaving the serrations 34 too wide, a cut may not align closely with a surface discontinuity. This failure of a cut 37 to align perfectly with an edge of a discontinuity may cause a small gap 42 at the discontinuity as shown in FIG. 6. However, gap 42 is truncated by the next adjacent serration 34. Thus, a gap resulting from the failure of a cut 37 to align perfectly with the edge of a discontinuity will still be smaller than a gap such as gap 15 shown in FIG. 1. Furthermore, each serration 34 may articulate somewhat in the plane P of the gasket. In some cases this articulation may allow a cut 37 to be placed over discontinuity, thereby eliminating any gap between the EMI gasket material and the structure abutting the gasket.

The length of a particular cut 37 is preferably chosen based on the location of a discontinuity to be sealed by the gasket. For example, if a discontinuity is known to exist at a point located an inch from the edge of gasket 20, the cut 37 at that point in the periphery of the gasket should extend into the gasket material at least an inch from the gasket edge. However, if discontinuities between the structures intended to be sealed by gasket 20 are known to include discontinuities only very near the edge of the gasket, then the cuts 37 may be relatively short, but long enough to extend past the area where discontinuities may be present. Deeper or longer cuts 37 generally allow the resulting serrations 34 to be displaced more easily to accommodate a discontinuity such as that shown in FIG. 5. However, cuts 37 should not extend into the gasket material so far as to substantially interfere with the conductive properties of the gasket material. In any event, EMI gasket 20 is constructed so that there is sufficient gasket material at each edge to accommodate cuts 37 of the desired length.

The above described preferred embodiments are intended to illustrate the principles of the invention, but not to limit the scope of the invention. Various other embodiments and modifications to these preferred embodiments may be made by those skilled in the art without departing from the scope of the following claims. For example, the EMI shield interface between connector base 26 and a computer chassis wall 22 is shown only for illustrating the invention. The EMI gasket structure according to the invention is also helpful in eliminating gaps which may occur between two walls which fasten together to form a portion of an EMI shield. Furthermore, an EMI gasket within the scope of the invention may itself form a primary portion of an EMI shield rather than simply provide a good seal between components which form an EMI shield. To illustrate this point, chassis wall 22 in the figures could be formed from a nonconductive material. In this case, gasket 20 and the connector bases 26 would form the desired portion of the EMI shield.

What is claimed is:

1. An EMI gasket of the type having a planar sealing edge which is adapted to be compressed in a direction perpendicular to the plane of the sealing edge to form a seal between two surfaces, the EMI gasket comprising:

(a) a resilient base material making up a base for the sealing edge;

(b) an electrically conductive material associated with the resilient base material, the electrically conductive material providing an electrically conductive surface for the gasket; and (c) a plurality of independently articulating serrations formed along the sealing edge of the gasket, the serrations on the sealing edge of the gasket being formed by a plurality of spaced apart cuts, each cut extending substantially normal to the sealing edge.

2. The EMI gasket of claim 1 wherein the resilient base material comprises a core of resilient material, and the electrically conductive material comprises a layer of material covering the core of resilient material.

3. The EMI gasket of claim 2 wherein the core of resilient material comprises a foam material.

4. The EMI gasket of claim 2 wherein the electrically conductive material comprises a fabric of electrically conductive fibers.

5. In an EMI gasket of the type having a planar sealing edge which is adapted to be compressed in a direction perpendicular to the plane of the sealing edge to form a seal between two surfaces, the improvement comprising:

(a) a plurality of independently articulating serrations formed along the sealing edge of the gasket, the serrations on the sealing edge of the gasket being formed by a plurality of spaced apart cuts, each cut extending substantially normal to the sealing edge.

6. The EMI gasket of claim 5 further including:

(a) a core of resilient material; and (b) a layer of electrically conductive material covering the core of resilient material.

7. The EMI gasket of claim 6 wherein the core of resilient material comprises a foam material.

8. The EMI gasket of claim 6 wherein the electrically conductive material comprises a fabric formed from electrically conductive fibers.

9. A computer system including:

(a) at least one interface between a computer system internal structure and a protective enclosure;

(b) an EMI gasket having a planar sealing edge interposed between the internal structure and the protective enclosure, the sealing edge being compressed between the internal structure and protective enclosure in a direction perpendicular to the plane of the sealing edge; and (c) a plurality of independently articulating serrations arranged in a side-by-side relationship along the sealing edge of the gasket, the serrations on the sealing edge of the gasket being formed by a plurality of spaced apart cuts, each cut extending substantially normal to the sealing edge.

10. The computer system of claim 9 wherein:

(a) the internal structure comprises a structure including at least one system connector; and (b) the protective enclosure comprises a portion of the computer system chassis.

11. The computer system of claim 9 wherein the EMI gasket further includes:

(a) a core of resilient material; and (b) a layer of electrically conductive material covering the core of resilient material.

12. The computer system of claim 11 wherein the core of resilient material comprises a foam material.

13. The computer system of claim 11 wherein the electrically conductive material comprises a fabric of electrically conductive fibers.

14. A method of forming an EMI barrier, the method comprising the steps of:

(a) placing an EMI gasket between an electrically conductive first structure and an electrically conductive second structure, the first structure and the second structure being adapted to be placed together to form an EMI barrier;

(b) compressing the EMI gasket between the first structure and the second structure in a direction substantially perpendicular to a plane of the gasket; and (c) displacing at least one independently articulating serration from the plane of the gasket as the EMI gasket is compressed between the first structure and the second structure, each serration being formed between two respective cuts in the gasket material, each cut extending substantially normal to an edge of the gasket in which the serration is formed, the displacement of each serration accommodating a surface discontinuity between the first structure and second structure.

15. The method of claim 14 wherein the two cuts in the gasket material extend from the edge of the gasket material at least to a point at which the discontinuity contacts the gasket material.

16. The method of claim 14 wherein the step of displacing at least one serration comprises:

(a) compressing said at least one serration further than an adjacent serration.

* * * * *